United States Patent [19]
Samukawa et al.

[11] Patent Number: 5,565,738
[45] Date of Patent: Oct. 15, 1996

[54] PLASMA PROCESSING APPARATUS WHICH USES A UNIQUELY SHAPED ANTENNA TO REDUCE THE OVERALL SIZE OF THE APPARATUS WITH RESPECT TO THE PLASMA CHAMBER

[75] Inventors: Seiji Samukawa, Tokyo; Kibatsu Shinohara; Hirobumi Matsumoto, both of Kanagawa; Tsutomu Tsukada; Yukito Nakagawa, both of Tokyo, all of Japan

[73] Assignees: NEC Corporation, Tokyo; Nihon Koshuha Co., Ltd., Kanagawa; Anelva Corporation, Tokyo, all of Japan

[21] Appl. No.: 440,453

[22] Filed: May 12, 1995

[30] Foreign Application Priority Data

May 12, 1994 [JP] Japan ..................... 6-122978

[51] Int. Cl.⁶ .................................... H05B 37/00
[52] U.S. Cl. ..................... 315/111.51; 315/111.81
[58] Field of Search ................. 315/111.51, 111.21, 315/111.81; 219/121.52; 204/192.1, 298.04

[56] References Cited

U.S. PATENT DOCUMENTS

| | | |
|---|---|---|
| 4,559,100 | 12/1985 | Ninomiya et al. ............ 156/345 |
| 4,804,431 | 2/1989 | Ribner ............................ 156/345 |
| 5,036,252 | 7/1991 | Löb ............................... 315/111.31 |
| 5,397,962 | 3/1995 | Moslehi ......................... 315/111.51 |

FOREIGN PATENT DOCUMENTS 6179968  6/1994  Japan.

*Primary Examiner*—Robert Pascal
*Assistant Examiner*—David H. Vu
*Attorney, Agent, or Firm*—Sughrue, Mion, Zinn, Macpeak & Seas

[57] ABSTRACT

A plasma processing apparatus comprises a plasma chamber having a gas inlet opening and a gas outlet opening. A first high-frequency energy source supplies accelerating energy to a holder that supports a semiconductor specimen within the chamber to produce a high-frequency accelerating electric field. Gas is introduced to the chamber through the inlet opening and accelerated by the electric field toward the specimen. An antenna structure is connected to a second high-frequency energy source which supplies exciting energy at a frequency in the range between 100 MHz and 1 GHz which is higher than the frequency of the accelerating energy. The antenna structure has radially outwardly extending, circumferentially equally spaced apart elements of length equal to the quarter wavelength of the exciting energy so that there is a phase difference of 180 degrees between adjacent ones of the antenna elements. The accelerated gas is uniformly excited and converted to high-density plasma.

13 Claims, 5 Drawing Sheets

PLASMA PROCESSING APPARATUS WHICH USES A UNIQUELY SHAPED ANTENNA TO REDUCE THE OVERALL SIZE OF THE APPARATUS WITH RESPECT TO THE PLASMA CHAMBER

BACKGROUND OF THE INVENTION

1. Field of the Invention

The present invention relates to a plasma processing apparatus for processing semiconductor substrates.

2. Description of the Related Art

Plasma processing technique such as etching using microwave energy is known in the art. As disclosed in Japanese Provisional Patent Publication Sho-60-134423, a semiconductor specimen substrate is placed inside a plasma chamber which is surrounded by solenoid coils to produce a high density magnetic field in the chamber, and gas and microwave energy are injected to the chamber so that the gas is allowed to react with the microwave energy and the magnetic field to produce a reactive plasma. However, one disadvantage of the prior art plasma processing apparatus is that due to the use of solenoid coils the overall size of the apparatus is disproportionately large in comparison with the plasma chamber, making it difficult to increase the size of the plasma chamber.

SUMMARY OF THE INVENTION

It is therefore an object of the present invention to provide a plasma processing apparatus having a plasma chamber which occupies a greater portion of the apparatus than the portion of prior art plasma chambers that occupies their plasma processing apparatus.

The plasma processing apparatus comprises a plasma chamber having a gas inlet opening and a gas outlet opening, a first high-frequency energy source, and means for holding a specimen within the chamber, the holding means being connected to the first high-frequency energy source for producing a high-frequency electric field which accelerates gas introduced to the chamber through the gas inlet opening toward the specimen. According to the present invention, the plasma processing apparatus includes a second high-frequency energy source and an antenna structure connected to the second high-frequency energy source. The antenna structure has a plurality of antenna elements of length equal to the quarter wavelength of energy generated by the second high-frequency energy source for producing high-frequency electric fields in the chamber to excite the accelerated gas.

Preferably, the antenna elements radially extend outwards from a center axis and are circumferentially equally spaced apart from each other and are arranged so that there is a phase difference of 180 degrees between adjacent ones of the antenna elements. The frequency of the energy generated by the second high-frequency energy source is in the range between 100 MHz and 1 GHz. The excited gas is uniformly distributed and converted to high-density plasma.

BRIEF DESCRIPTION OF THE DRAWINGS

The present invention will be described in further detail with reference to the accompanying drawings, in which.

DETAILED DESCRIPTION

Figure 1:
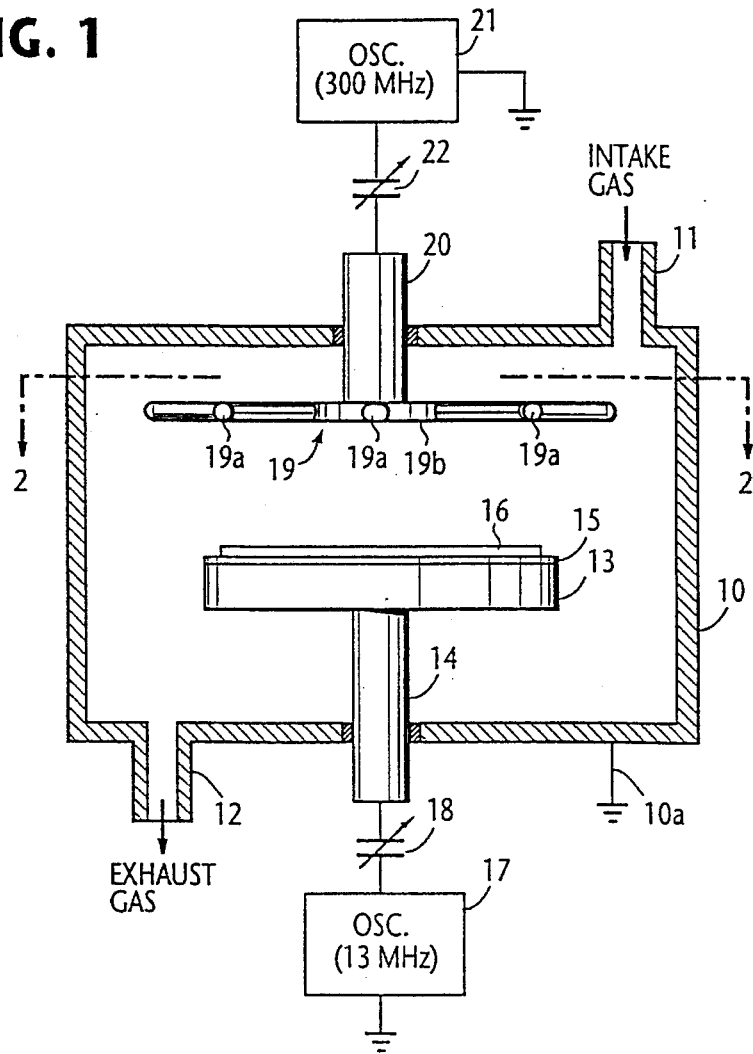
FIG. 1 is a cross-sectional view in elevation of a plasma processing apparatus according to a first embodiment of the present invention.
Figure 2:
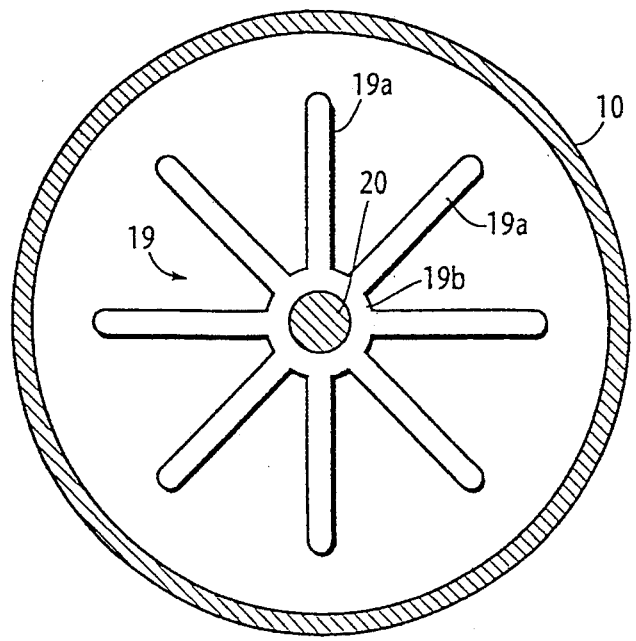
FIG. 2 is a cross-sectional view taken along the lines 2—2 of FIG. 1.

Referring now to FIGS. 1 and 2, a plasma processing apparatus according to a first embodiment of the present invention is illustrated. The apparatus comprises a cylindrical plasma chamber 10, which is grounded at 10a and has a diameter of 500 millimeters. On top of the chamber is a gas inlet opening 11 for introducing reactive gas to the chamber and at the bottom of the chamber is an exhaust opening 12 for discharging the gas. A substrate holder 13 of conductive material is supported within the chamber by means of a cylindrical metal support 14 which extends through the bottom of the chamber and is firmly secured thereto so that the holder 13 is secured in an appropriate position. The upper surface of the substrate holder 13 is covered with a dielectric layer 15 on which is placed a specimen substrate 16. To the lower end of the metal support 14 is connected a high-frequency energy source or oscillator 17 via a variable capacitor 18 to generate a 13-MHz high-frequency field for accelerating the reactive gas in a direction toward the specimen 16.

Within the plasma chamber 10 is provided an 8-element antenna structure 19 formed of aluminum having elements 19a extending radially outwards from a hub portion 19b as seen in FIG. 2. The antenna structure 19 is connected at the hub portion 19b to a cylindrical metal support 20 that extends through the top of chamber 10 and is connected to a 300-MHz oscillator 21 via a variable capacitor 22 to emit the high-frequency energy to the specimen 16. Each antenna element 19a has a length equal to the quarter wavelength of the 300-MHz VHF energy to produce a standing-wave field pattern. Uniformly distributed VHF electric fields are produced. Due to the standing wave of VHF fields, conditions can be easily met for ion-cyclotron resonance in the plasma in the absence of magnetic field. As a result, the reactive gas is uniformly distributed and converted to high-density plasma.

Experiments showed that the frequency of the oscillator 21 that can be used for the purpose of the present invention is in the range from 100 MHz to 1 GHz. Variable capacitor 22 is used to control the frequency of the VHF energy produced in the plasma chamber 10.

Figure 3:
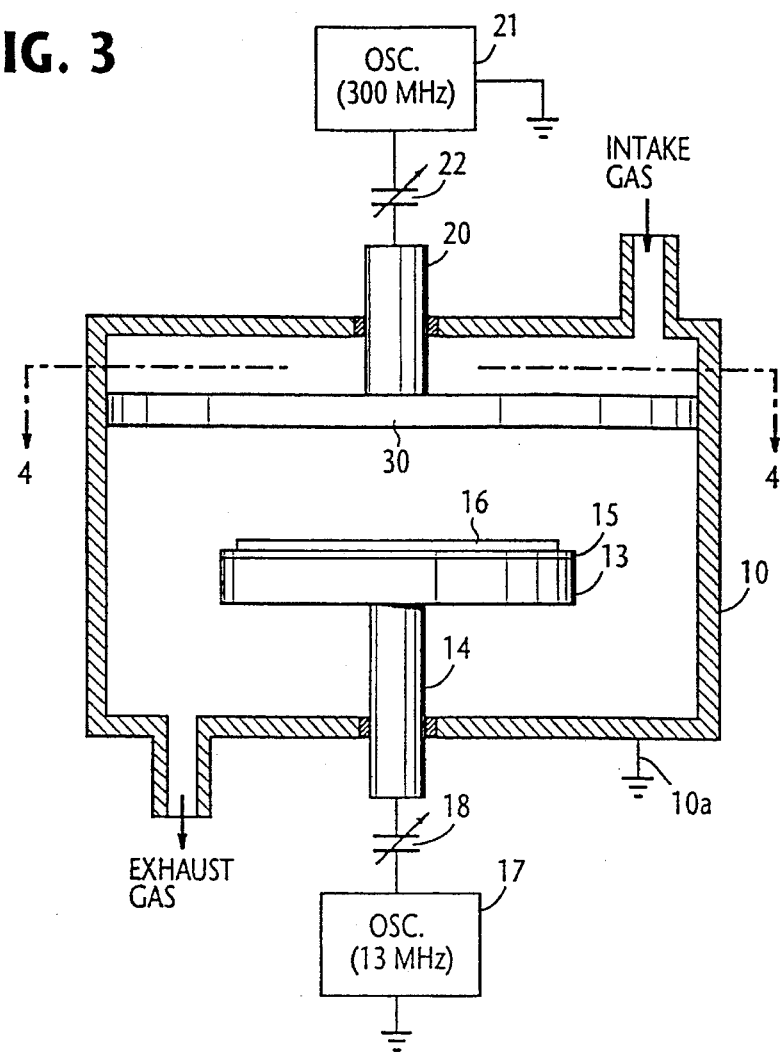
FIG. 3 is a cross-sectional view in elevation of a plasma processing apparatus according to a second embodiment of the present invention.
Figure 4:
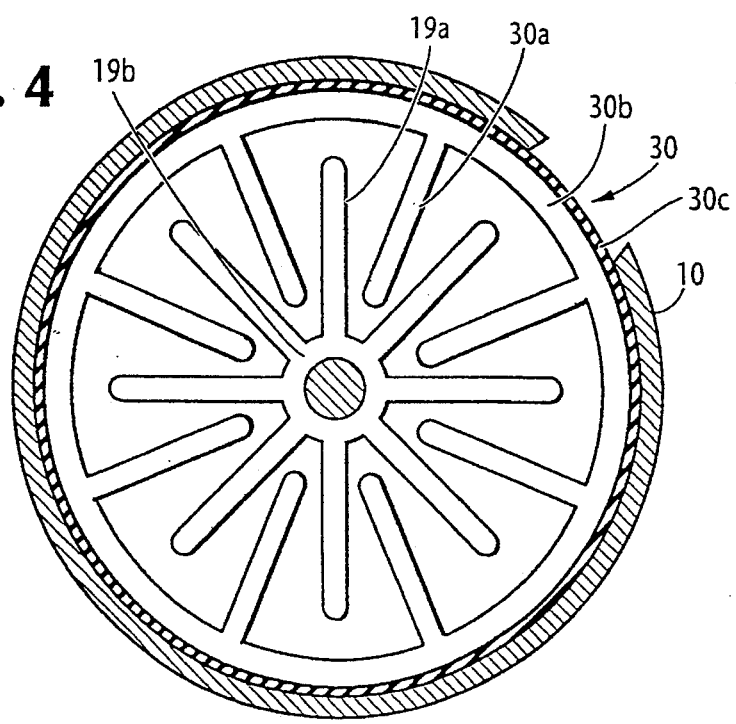
FIG. 4 is a cross-sectional view taken along the lines 4—4 of FIG. 3.

A modified form of the present invention is shown in FIGS. 3 and 4 in which an 8-element outer antenna 30 is provided in the plasma chamber 10 and the antenna 19 serves an inner antenna. Antenna 30 has elements 30a of length equal to the quarter wavelength of the VHF energy.

Each antenna element 30a extends inwards from a ring portion 30b toward the hub portion 19b of antenna 19 which is secured to the lower end of support 20. A ring 30c of insulating material is firmly secured between the ring portion 30b and the inner wall of the chamber 10 to support the antenna 30. The elements 30a of antenna 30 are interdigitally positioned with respect to the elements 19a of antenna 19. Since the plasma chamber 10 is grounded, each antenna element 30a is capacitively coupled to adjacent antenna elements 19a to provide uniformly distributed high-frequency electric fields. A phase difference of 180 degrees is produced between adjacent antenna elements 19a and 30a. In this way, uniformly distributed VHF electric fields are produced within the chamber 10o Due to the uniform distribution of VHF fields, conditions can be easily met for ion-cyclotron resonance in the plasma in the absence of a magnetic field. As a result, the reactive gas is uniformly distributed and converted to high-density plasma.

Figure 5:
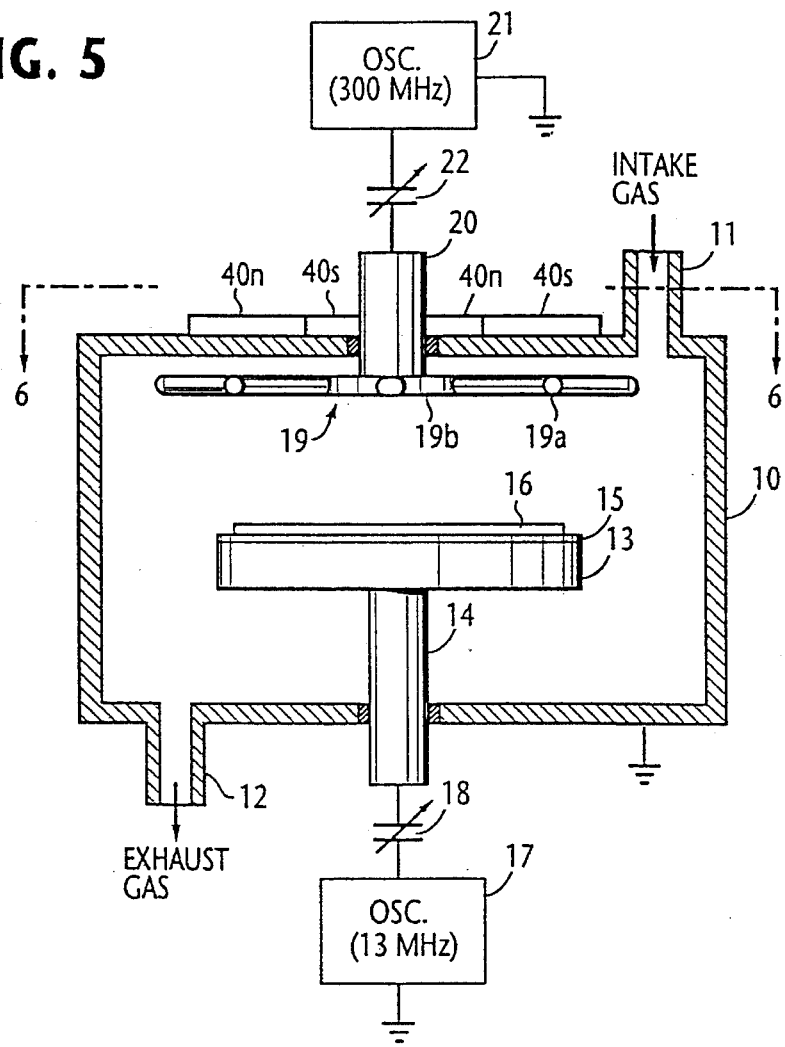
FIG. 5 is a cross-sectional view in elevation of a plasma processing apparatus according to a third embodiment of the present invention.
Figure 6:
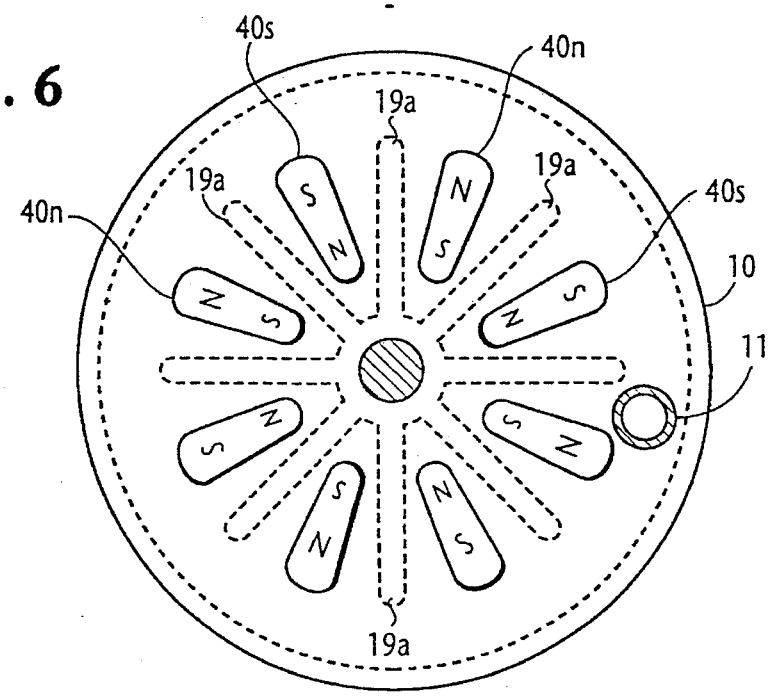
FIG. 6 is a cross-sectional view taken along the lines 6—6 of FIG. 5.

In order to satisfy the conditions for ion-cyclotron resonance, permanent magnets 40 are secured on top of the plasma chamber 10 as shown in FIGS. 5 and 6. As seen in FIG. 6, opposite poles of these magnets are arranged circumferentially about the vertical center axis of antenna 19 so that they alternate each other. As viewed from above, each magnet is located between adjacent antenna elements 19a. With the arrangement of these permanent magnets, magnetic fields are generated that intersect the electric fields produced by the antenna elements 19a.

Figure 7:
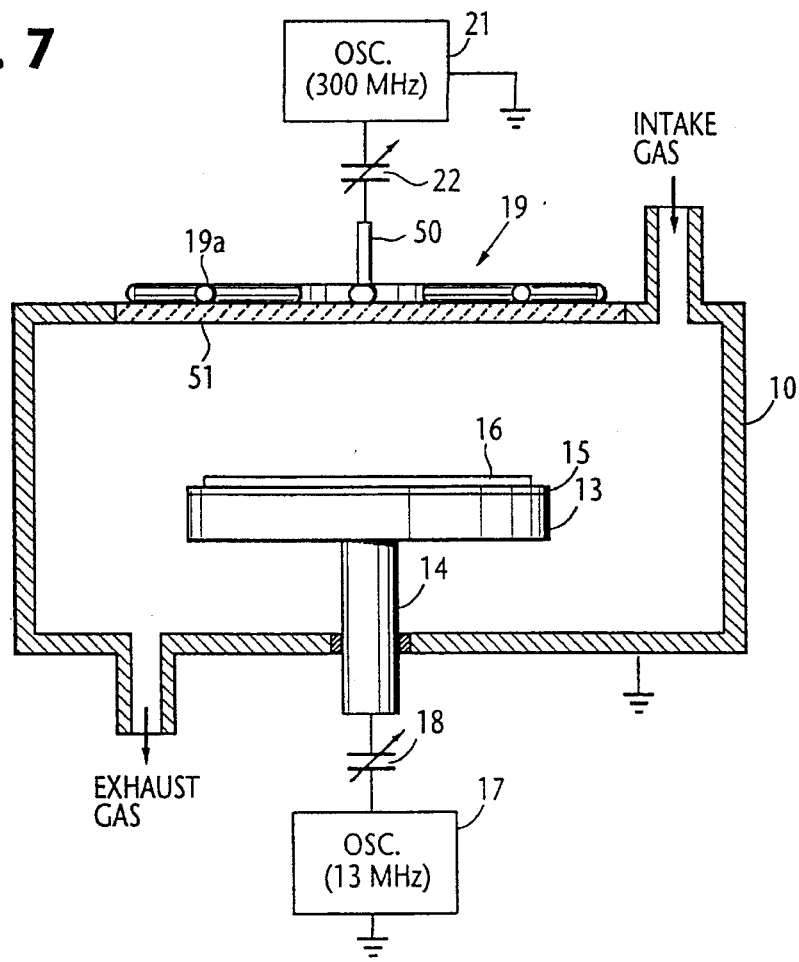
FIG. 7 is a cross-sectional view in elevation of a plasma processing apparatus of a further modified embodiment.

In an alternative embodiment, the antenna 19 is mounted outside of the plasma chamber 10 as illustrated in FIG. 7. In this embodiment, contamination of plasma by metallic particles can be avoided. As illustrated, the antenna 19 is connected to the high-frequency energy source 21 via a feeder 50 and secured on a dielectric layer 51 of material such as quartz or ceramics which forms part of the top of the plasma chamber 10.

Figure 8:
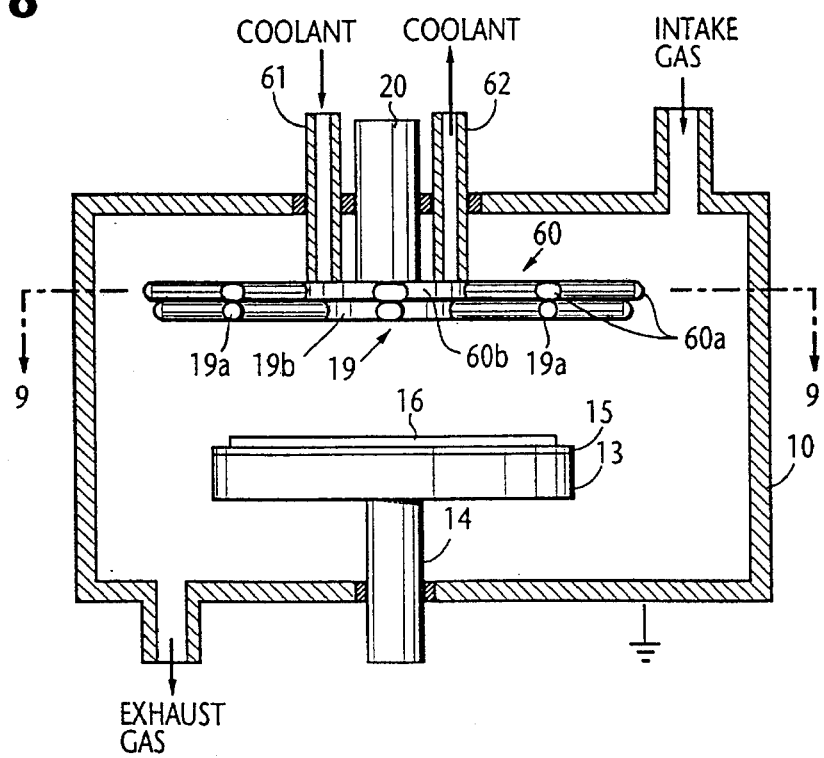
FIG. 8 is a cross-sectional view in elevation of a plasma processing apparatus in which a cooling system is provided for cooling the heated antenna.
Figure 9:
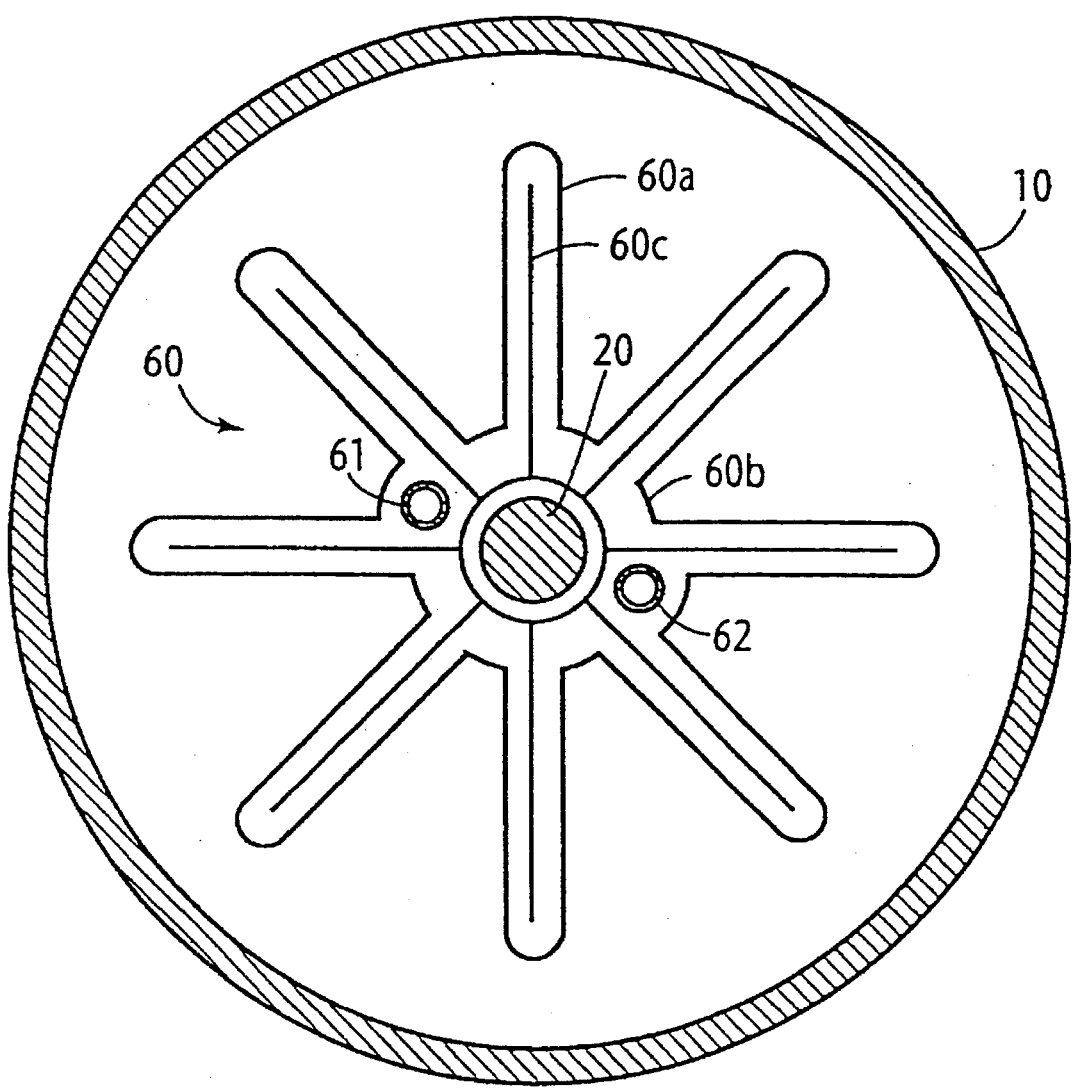
FIG. 9 is a cross-sectional view taken along the lines 9—9 of FIG. 8.

Since the antenna 19 is heated by the plasma, it is desirable to provide a cooling system 60 as shown in FIGS. 8 and 9. The cooling system 60 has a plurality of cooling elements 60a extending radially outwards from a hub portion 60b. A coolant inlet pipe 61 and a coolant outlet pipe 62 extend through the top wall of plasma chamber 10 to the hub portion 60b of the coolant system. Cooling elements 60a are in an intimate thermal transfer contact with corresponding antenna elements 19a. Each cooling element 60a is partitioned by a wall 60c to form inlet and outlet passages so that they respectively communicate with inlet pipe 61 and outlet pipe 62 as shown in FIG. 9. Liquid coolant is pumped into the cooling elements through the inlet pipe 61 and discharged through the outlet pipe 62.

What is claimed is:

1. A plasma processing apparatus comprising:

a plasma chamber having a gas inlet opening and a gas outlet opening;

a first high-frequency energy source;

means for holding a specimen within said chamber, the holding means being connected to the first high-frequency energy source for producing a high-frequency electric field which accelerates gas introduced to said chamber through the gas inlet opening toward said specimen;

a second high-frequency energy source; and an antenna structure connected to the second high-frequency energy source comprising a plurality of antenna elements radially extending outward from a center axis and circumferentially spaced equally apart from one another, said antenna elements being of length equal to the quarter wavelength of energy generated by the second high-frequency energy source for producing high-frequency electric fields in said chamber to excite said accelerated gas.

2. A plasma processing apparatus as claimed in claim 1 further comprising a plurality of permanent magnets for producing magnetic fields which intersect the high-frequency electric fields produced by said antenna structure.

3. A plasma processing apparatus as claimed in claim 2, wherein said permanent magnets are arranged circumferentially about the center axis of said antenna structure such that adjacent magnets have magnetic polarity opposite to one another.

4. A plasma processing apparatus as claimed in claim 1, wherein said antenna structure is located in said plasma chamber, further comprising means for supporting the antenna structure and applying the energy from said second high-frequency energy source.

5. A plasma processing apparatus as claimed in claim 4, further comprising means for cooling said antenna structure.

6. A plasma processing apparatus as claimed in claim 1, wherein said antenna structure is located outside of said plasma chamber, further comprising means for providing insulation between the antenna structure and said plasma chamber.

7. A plasma processing apparatus as claimed in claim 1, wherein the frequency of the energy generated by said second high-frequency energy source is higher than the frequency of energy generated by the first high-frequency energy source.

8. A plasma processing apparatus as claimed in claim 7, wherein the frequency of the energy generated by said second high-frequency energy source is in the range between 100 MHz and 1 GHz.

9. A plasma processing apparatus as claimed in claim 1 wherein said antenna structure is a radio frequency antenna structure and said antenna elements are radio frequency antenna elements.

10. A plasma processing apparatus comprising:

a plasma chamber having a gas inlet opening and a gas outlet opening;

a first high-frequency energy source;

means for holding a specimen within said chamber, the holding means being connected to the first high-frequency energy source for producing a high-frequency electric field which accelerates gas introduced to said chamber through the gas inlet opening toward said specimen;

a second high-frequency energy source; and an antenna structure connected to the second high-frequency energy source comprising:

a plurality of first antenna elements radially extending outward from a center axis and circumferentially spaced equally apart from one another, said antenna elements being of length equal to the quarter wavelength of energy generated by the second high-frequency energy source for producing high-frequency electric fields in said chamber to excite said accelerated gas;

a plurality of second antenna elements radially extending inward from sidewalls of said chamber, said second antenna elements being circumferentially equally spaced apart from one another and being interdigitally located with respect to the first radially extending outward antenna elements, wherein any two adjacent interdigitally located antenna elements have a phase difference of 180 degrees therebetween.

11. A plasma processing apparatus as claimed in claim 10, wherein the frequency of the energy generated by said second high-frequency energy source is higher than the frequency of energy generated by the first high-frequency energy source.

12. A plasma processing apparatus as claimed in claim 11, wherein the frequency of the energy generated by said second high-frequency energy source is in the range between 100 MHz and 1 GHz.

13. A plasma processing apparatus as claimed in claim 10, further comprising means for cooling said antenna structure.

* * * * *